United States Patent
Kim

(10) Patent No.: US 9,012,258 B2
(45) Date of Patent: Apr. 21, 2015

(54) METHOD OF MANUFACTURING AN ORGANIC LIGHT-EMITTING DISPLAY APPARATUS USING AT LEAST TWO DEPOSITION UNITS

(71) Applicant: Samsung Display Co., Ltd., Yongin-si, Gyeonggi-Do (KR)

(72) Inventor: Hak-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/794,748

(22) Filed: Mar. 11, 2013

(65) Prior Publication Data

US 2014/0084262 A1 Mar. 27, 2014

(30) Foreign Application Priority Data

Sep. 24, 2012 (KR) .................. 10-2012-0105952

(51) Int. Cl.
| | |
|---|---|
| *H01L 27/32* | (2006.01) |
| *H01L 51/56* | (2006.01) |
| *H01L 51/00* | (2006.01) |
| *C23C 14/02* | (2006.01) |
| *C23C 14/04* | (2006.01) |
| *C23C 14/56* | (2006.01) |

(52) U.S. Cl.
CPC ........ *H01L 51/0004* (2013.01); *H01L 27/3244* (2013.01); *H01L 51/0011* (2013.01); *C23C 14/024* (2013.01); *C23C 14/042* (2013.01); *C23C 14/568* (2013.01)

(58) Field of Classification Search
CPC .................................................. H01L 51/0011
See application file for complete search history.

(56) References Cited

U.S. PATENT DOCUMENTS

| | | | |
|---|---|---|---|
| 5,454,847 | A | 10/1995 | Jacoboni et al. |
| 6,099,649 | A | 8/2000 | Schmitt et al. |
| 6,274,198 | B1 | 8/2001 | Dautartas |
| 6,371,451 | B1 | 4/2002 | Choi |
| 6,749,906 | B2 | 6/2004 | Van Slyke |

(Continued)

FOREIGN PATENT DOCUMENTS

| | | |
|---|---|---|
| EP | 1 413 644 A2 | 4/2004 |
| EP | 1 418 250 A2 | 5/2004 |

(Continued)

OTHER PUBLICATIONS

Machine English Translation of JP 2001-052862, 20 pages, published Feb. 2001.

(Continued)

*Primary Examiner* — Stephen W Smoot
(74) *Attorney, Agent, or Firm* — Christie, Parker & Hale, LLP

(57) ABSTRACT

An organic layer deposition apparatus, a method of manufacturing the same, and an organic light-emitting display apparatus using the same, and an organic light-emitting display apparatus manufactured using the method, are disclosed. An organic layer deposition apparatus is suitable for mass production of organic light-emitting display apparatuses on large-size substrates, and enables high-precision patterning. A method of manufacturing an organic light-emitting display apparatus by using the organic layer deposition apparatus, and an organic light-emitting display apparatus manufactured using the method, are disclosed.

24 Claims, 12 Drawing Sheets

(56) References Cited

U.S. PATENT DOCUMENTS

| | | |
|---|---|---|
| 7,322,248 B1 | 1/2008 | Long |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0016907 A1 | 1/2004 | Shi |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0001546 A1 | 1/2005 | Yamaguchi |
| 2005/0011136 A1 | 1/2005 | Filippi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072361 A1 | 4/2005 | Yang et al. |
| 2005/0166842 A1 | 8/2005 | Sakamoto |
| 2005/0217584 A1 | 10/2005 | Abiko et al. |
| 2005/0263074 A1 | 12/2005 | Masuda et al. |
| 2006/0144325 A1 | 7/2006 | Jung et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0178708 A1 | 8/2007 | Ukigaya |
| 2007/0195844 A1 | 8/2007 | Ma et al. |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0229524 A1 | 9/2009 | Kim et al. |
| 2009/0232976 A1 | 9/2009 | Yoon et al. |
| 2009/0304906 A1 | 12/2009 | Suduo et al. |
| 2010/0170439 A1 | 7/2010 | Negishi |
| 2010/0255198 A1 | 10/2010 | Cleary et al. |
| 2010/0275842 A1 | 11/2010 | Park et al. |
| 2010/0297348 A1 | 11/2010 | Lee et al. |
| 2010/0297349 A1 | 11/2010 | Lee et al. |
| 2011/0052791 A1 | 3/2011 | Jo et al. |
| 2011/0165327 A1 | 7/2011 | Park et al. |
| 2012/0174865 A1 | 7/2012 | Choi et al. |
| 2013/0341598 A1* | 12/2013 | Chang et al. .............. 257/40 |
| 2014/0014917 A1* | 1/2014 | Lee et al. .................. 257/40 |

FOREIGN PATENT DOCUMENTS

| | | |
|---|---|---|
| EP | 1 518 940 A1 | 3/2005 |
| JP | 04-272170 A | 9/1992 |
| JP | 05-098425 A | 4/1993 |
| JP | 2000-68054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-091858 A | 3/2004 |
| JP | 2004-103269 A | 4/2004 |
| JP | 2004-103341 A | 4/2004 |
| JP | 2004-107764 | 4/2004 |
| JP | 2004-199919 A | 7/2004 |
| JP | 2004-349101 | 12/2004 |
| JP | 2005-044592 A | 2/2005 |
| JP | 2005-235568 A | 9/2005 |
| JP | 2005-293968 | 10/2005 |
| JP | 2005-293968 A | 10/2005 |
| JP | 2005-296737 A | 10/2005 |
| JP | 2006-275433 A | 10/2006 |
| JP | 2007-047293 A | 2/2007 |
| JP | 2008-121098 A | 5/2008 |
| JP | 2008-248301 A2 | 10/2008 |
| JP | 2009-019243 A | 1/2009 |
| JP | 2009-087910 A | 4/2009 |
| KR | 10-2000-0019254 A | 4/2000 |
| KR | 10-2000-0023929 A | 4/2000 |
| KR | 10-1997-0054303 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-0405080 B1 | 11/2003 |
| KR | 10-2003-0093959 A | 12/2003 |
| KR | 10-2003-00919047 A | 12/2003 |
| KR | 20-0342433 Y1 | 2/2004 |
| KR | 10-2004-0034537 A | 4/2004 |
| KR | 10-2004-0050045 A | 6/2004 |
| KR | 10-2004-0069281 A | 8/2004 |
| KR | 10-2004-0084747 A | 10/2004 |
| KR | 10-2004-0110718 | 12/2004 |
| KR | 10-0463212 B1 | 12/2004 |
| KR | 10-2005-0018234 A | 2/2005 |
| KR | 10-2005-0028943 A | 3/2005 |
| KR | 10-2005-0039140 A | 4/2005 |
| KR | 10-0520159 B1 | 10/2005 |
| KR | 10-0532657 B1 | 12/2005 |
| KR | 10-2006-0008602 A | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 | 7/2006 |
| KR | 10-2006-0081943 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109561 A | 10/2006 |
| KR | 10-2006-0109627 A | 10/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0098122 A | 10/2007 |
| KR | 10-2007-0101842 A | 10/2007 |
| KR | 10-2007-0105595 A | 10/2007 |
| KR | 10-0770653 B1 | 10/2007 |
| KR | 10-2007-0114094 A | 11/2007 |
| KR | 10-2008-0001184 A | 1/2008 |
| KR | 10-2008-0003720 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-2008-0044775 A | 5/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2009-0038733 A | 4/2009 |
| KR | 10-2009-0047953 A | 5/2009 |
| KR | 10-2009-0052828 A | 5/2009 |
| KR | 10-2009-0097453 A | 9/2009 |

(56) References Cited

FOREIGN PATENT DOCUMENTS

| KR | 10-2010-0119368 A | 11/2010 |
|---|---|---|
| KR | 10-2010-0126125 A | 12/2010 |
| KR | 10-2010-0130786 | 12/2010 |
| KR | 10-2010-0133678 A | 12/2010 |
| KR | 10-2011-0022512 A | 3/2011 |
| KR | 10-2011-0082418 A | 7/2011 |
| KR | 10-2012-0081811 A | 7/2012 |

OTHER PUBLICATIONS

Machine English Translation of JP 2003-003250, 25 pages, published Jan. 2003.
Korean Office action dated Jan. 6, 2012 for corresponding Korean Patent No. 10-2010-0000897, 4 pages.
Korean Office action dated Mar. 21, 2012 for corresponding Korean Patent No. 10-2010-0065465, 5 pages.
Korean Office action dated Apr. 4, 2012 for corresponding Korean Patent No. 10-2009-0112796, 5 pages.
Korean Registration Determination Certificate dated Jul. 20, 2012 for corresponding Korean Patent No. 10-2010-000897, 5 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2008-0022592 A, dated Mar. 11, 2008, for corresponding Korean Patent No. Oct. 2009-0097453, 2 pages.
Korean Patent Abstracts, Publication No. 10-0257219 B1, dated Feb. 29, 2000, for corresponding Korean Patent No. 10-1997-0054303 A, 2 pages.
Korean Patent Abstracts, Publication No. 10-2004-0043360 A, dated Dec. 2, 2005, for corresponding Korean Patent No. 10-0532657 B1, 2 pages.
Korean Patent Abstracts, Publication No. 2008-0002189 A, dated Jan. 4, 2008, for corresponding Korean Patent No. 10-0800125 B1, 1 page.
U.S. Office action dated Aug. 21, 2013 issued in cross-reference U.S. Appl. No. 12/820,355 (14 pages).
U.S. Office action dated May 16, 2013, for cross reference U.S. Appl. No. 13/235,337, (28 pages).
U.S. Office action dated Apr. 29, 2013, for cross reference U.S. Appl. No. 12/820,355, (31 pages).
English machine translation of Japanese Publication 2004-107764, dated Apr. 8, 2004, listed above, (10 pages).
Patent Abstracts of Japan, and English machine translation of Japanese Publication 2004-349101 dated Dec. 9, 2004, listed above, (11 pages).

* cited by examiner

METHOD OF MANUFACTURING AN ORGANIC LIGHT-EMITTING DISPLAY APPARATUS USING AT LEAST TWO DEPOSITION UNITS

CROSS-REFERENCE TO RELATED APPLICATION

This application claims priority to and the benefit of Korean Patent Application No. 10-2012-0105952, filed on Sep. 24, 2012 in the Korean Intellectual Property Office, the entire content of which is incorporated herein by reference.

BACKGROUND

1. Field

Aspects of embodiments of the present invention relate to an organic layer deposition apparatus, a method of manufacturing an organic light-emitting display apparatus using the same, and an organic light-emitting display apparatus manufactured using the method.

2. Description of the Related Art

Among display apparatuses, organic light-emitting display apparatuses have wider viewing angles, better contrast characteristics, and faster response speeds than other display apparatuses, and thus have drawn attention as a next-generation display apparatus.

An organic light-emitting display apparatus includes an emission layer between a first electrode and a second electrode that are disposed opposite to each other, and an intermediate layer including the emission layer. Here, the electrodes and the intermediate layer may be formed by using any of various methods, one of which is an independent deposition method. In order to manufacture an organic light-emitting display apparatus by using a deposition method, typically a fine metal mask (FMM) having the same pattern as that of an organic layer to be formed is tightly adhered to a surface of a substrate on which the organic layer is to be formed, and a material, such as an organic layer material, is deposited thereon, thereby forming the organic layer having a predetermined pattern.

However, such a method of using the FMM has a limitation in manufacturing a large-size organic light-emitting display apparatus by using a large-size mother glass, because if a large-size mask is used, the mask may be bent due to self-weight, which results in distortion of the pattern of the organic layer. This conflicts with a phenomenon requiring high-precision patterning.

In addition, since it takes a long time to align and tightly adhere a substrate and an FMM to each other, to perform deposition, and then to separate the substrate and the FMM from each other, a long manufacturing time is required, thereby decreasing production efficiency.

The above-described related art was considered by the inventor to derive embodiments of the present invention or is technical information obtained during the derivation of embodiments of the present invention, and thus it should not be assumed that the above-described related art was necessarily published or otherwise made available to the public before the conception of the present invention or filing of the present application.

SUMMARY

According to aspects of embodiments of the present invention, an organic layer deposition apparatus is further suitable for mass production of organic light-emitting display apparatuses on large-size substrates and enables high-precision patterning. According to further aspects of embodiments of the present invention, a method of manufacturing an organic light-emitting display apparatus by using the organic layer deposition apparatus described above, and an organic light-emitting display apparatus manufactured using the method, are provided.

According to an embodiment of the present invention, an organic layer deposition apparatus is provided. The organic layer deposition apparatus includes: a conveyer unit including a transfer unit on which a substrate is fixed and configured to move together with the fixed substrate, a first conveyer unit for moving the transfer unit to which the substrate is fixed in a first direction, and a second conveyer unit for moving the transfer unit from which the substrate is separated after deposition in a second direction opposite to the first direction; a loading unit for fixing the substrate to the transfer unit; a deposition unit including a chamber maintained at a vacuum, and a plurality of organic layer deposition assemblies for depositing an organic layer onto the substrate fixed to the transfer unit transferred from the loading unit; and an unloading unit for separating the substrate on which deposition has been completed while passing through the deposition unit from the transfer unit. The transfer unit is configured to circulate between the first conveyer unit and the second conveyer unit. The substrate fixed to the transfer unit is spaced from the organic layer deposition assemblies at an interval while being moved by the first conveyer unit. Each of the organic layer deposition assemblies includes a first organic layer deposition unit and a second organic layer deposition unit. The first organic layer deposition unit is arranged in such a way that a longitudinal direction of the first organic layer deposition unit is parallel to a longitudinal direction of the second organic layer deposition unit. Each of the first and second organic layer deposition units includes: a deposition source for discharging a deposition material; a deposition source nozzle unit that is at one side of the deposition source and to which one or more deposition source nozzles are formed; a patterning slit sheet that is opposite to the deposition source nozzle unit and in which one or more patterning slits are formed; and first and second sensors that are at two ends of the deposition source in a longitudinal direction of the deposition source to face each other and measure an amount of vaporization of the deposition material. The substrate is spaced from the organic layer deposition assembly at an interval to relatively move with respect to the organic layer deposition assembly, and the deposition material discharged from the deposition source passes through the patterning slit sheet and is deposited onto the substrate to form a pattern.

The first organic layer deposition unit may be not located on a virtual extending line in the longitudinal direction of the second organic layer deposition unit.

The first organic layer deposition unit and the second organic layer deposition unit may be arranged not to be superposed with each other in the first direction.

The longitudinal direction of the deposition source may be perpendicular to the first direction.

The deposition source may include: at least one crucible located in the longitudinal direction of the deposition source; a heater that surrounds the crucible and heats the crucible; and a cooling housing surrounding the heater.

The cooling housing may be configured to prevent heat generated by the heater from being discharged out of the deposition source.

The crucible may include a first crucible and a second crucible, and the first and second crucibles may be inside the cooling housing.

The first sensor may be configured to measure an amount of deposition material discharged from the first crucible, and the second sensor may be configured to measure an amount of deposition material discharged from the second crucible.

The first conveyer unit and the second conveyer unit may be configured to pass through the deposition unit.

The first conveyer unit and the second conveyer unit may be arranged one on top of the other and may be parallel to each other.

The first conveyer unit may move the transfer unit to the loading unit, the deposition unit, and the unloading unit in that order.

The second conveyer unit may be configured to move the transfer unit to the unloading unit, the deposition unit, and the loading unit in that order.

The patterning slit sheet of the organic layer deposition assembly may be smaller than the substrate in at least one of the first direction or a third direction that is substantially perpendicular to the first direction.

A plurality of the deposition source nozzles may be formed in the deposition source nozzle unit along a third direction that is substantially perpendicular to the first direction, a plurality of the patterning slits may be formed in the patterning slit sheet along the third direction, and the organic layer deposition apparatus may further include a blocking plate assembly including a plurality of first blocking plates that are arranged along the third direction between the deposition source nozzle unit and the patterning slit sheet to divide a space between the deposition source nozzle unit and the patterning slit sheet into a plurality of deposition spaces.

Each of the first blocking plates may extend in the first direction.

The blocking plate assembly may include a first blocking plate assembly including the plurality of first blocking plates and a second blocking plate assembly including a plurality of second blocking plates.

The first blocking plates and the second blocking plates may be arranged along the third direction that is substantially perpendicular to the first direction so that the space between the deposition source nozzle unit and the patterning slit sheet is divided into the plurality of deposition spaces.

A plurality of the deposition source nozzles may be formed in the deposition source nozzle unit along the first direction, and a plurality of the patterning slits may be formed in the patterning slit sheet in a third direction that is substantially perpendicular to the first direction.

The deposition source, the deposition source nozzle unit, and the patterning slit sheet may be coupled to each other as one body by a connection member.

The connection member may be configured to guide a transfer path of the deposition material.

The connection member may seal a space between the deposition source, the deposition source nozzle unit, and the patterning slit sheet.

In another embodiment according to the present invention, a method of manufacturing an organic light-emitting display apparatus by using an organic layer deposition apparatus for forming an organic layer on a substrate, is provided. The method includes: fixing the substrate to a transfer unit in a loading unit; transferring the transfer unit to which the substrate is fixed into a chamber by using a first conveyer unit configured to pass through the chamber; forming the organic layer by depositing a deposition material discharged from an organic layer deposition assembly onto the substrate while relatively moving the substrate with respect to the organic layer deposition assembly in such a way that the organic layer deposition assembly disposed inside the chamber is spaced from the substrate at an interval; separating the substrate on which deposition has been completed in the unloading unit from the transfer unit; and transferring the transfer unit separated from the substrate to the loading unit by using a second conveyer unit arranged to pass through the chamber. Each of the plurality of organic layer deposition assemblies includes a first organic layer deposition unit and a second organic layer deposition unit. The first organic layer deposition unit is arranged in such a way that a longitudinal direction of the first organic layer deposition unit is parallel to a longitudinal direction of the second organic layer deposition unit. Each of the first and second organic layer deposition units includes: a deposition source for discharging a deposition material; a deposition source nozzle unit that is at one side of the deposition source and at which one or more deposition source nozzles are formed; a patterning slit sheet that is opposite to the deposition source nozzle unit and in which one or more patterning slits are formed; and first and second sensors that are at two ends of the deposition source in a longitudinal direction of the deposition source to face each other and measure an amount of vaporization of the deposition material. The substrate is spaced from the organic layer deposition assembly at an interval to relatively move with respect to the organic layer deposition assembly. The deposition material discharged from the deposition source passes through the patterning slit sheet and is deposited onto the substrate to form a pattern.

A plurality of thin film deposition assemblies may be inside the chamber so that deposition is sequentially performed on the substrate by the thin film deposition assemblies.

The transfer unit may circulate between the first conveyer unit and the second conveyer unit.

The first conveyer unit and the second conveyer unit may be arranged one on top of the other, and may be parallel to each other.

The patterning slit sheet of the thin film deposition assembly may be smaller than the substrate in at least one of the first direction or a second direction perpendicular to the first direction.

An organic light-emitting display apparatus may include: a substrate; a plurality of thin film transistors (TFTs) on the substrate, each of the TFTs including a semiconductor active layer, a gate electrode insulated from the semiconductor active layer, and source and drain electrodes contacting the semiconductor active layer; a plurality of pixel electrodes respectively on the TFTs; a plurality of organic layers respectively on the pixel electrodes; and a counter electrode on the organic layers. A length of at least one slanted side between top and bottom sides of at least one of the plurality of organic layers on the substrate farther from a center of a deposition region is larger than lengths of slanted sides between the top and bottom sides of those other organic layers formed closer to the center of the deposition region, and at least one of the organic layers on the substrate is a linearly-patterned organic layer formed by using the organic layer deposition apparatus described above.

The substrate may have a size of 2200 mm×2500 mm or greater.

The organic layer may include at least an emission layer.

The organic layer may have a non-uniform thickness.

In each of the organic layers formed farther from the center of the deposition region, the length of the slanted side farther from the center of the deposition region may be larger than that of the other slanted side.

The farther one of the plurality of organic layers in the deposition region is from the center of the deposition region, the narrower an overlapped region of the top and bottom sides of the one of the plurality of organic layers may be formed.

The slanted sides between the top and bottom sides of the organic layer disposed at the center of the deposition region may have substantially the same length as each other.

The plurality of organic layers in the deposition region may be symmetrically arranged about the center of the deposition region.

BRIEF DESCRIPTION OF THE DRAWINGS

The above and other features and aspects of the present invention will become more apparent by describing in detail some exemplary embodiments thereof with reference to the attached drawings in which.

DETAILED DESCRIPTION

Hereinafter, exemplary embodiments of the present invention will be described in greater detail with reference to the accompanying drawings so that those of ordinary skill in the art may easily accomplish them. The present invention may be embodied in various forms and is thus not limited to the embodiments set forth herein.

As used herein, expressions such as "at least one of," when preceding a list of elements, modify the entire list of elements and do not modify the individual elements of the list.

Figure 1:
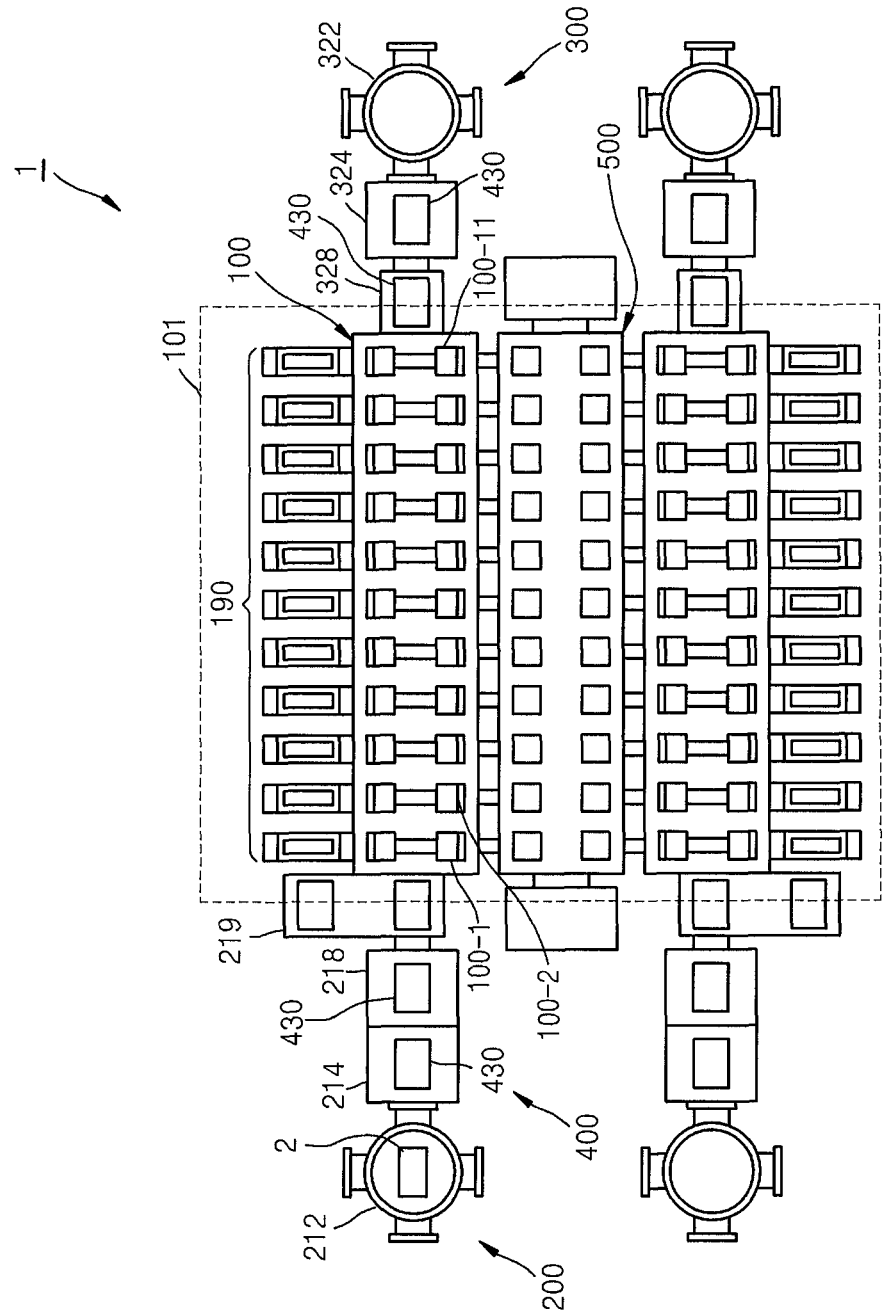
FIG. 1 is a schematic plan view of an organic layer deposition apparatus according to an embodiment of the present invention.
Figure 2:
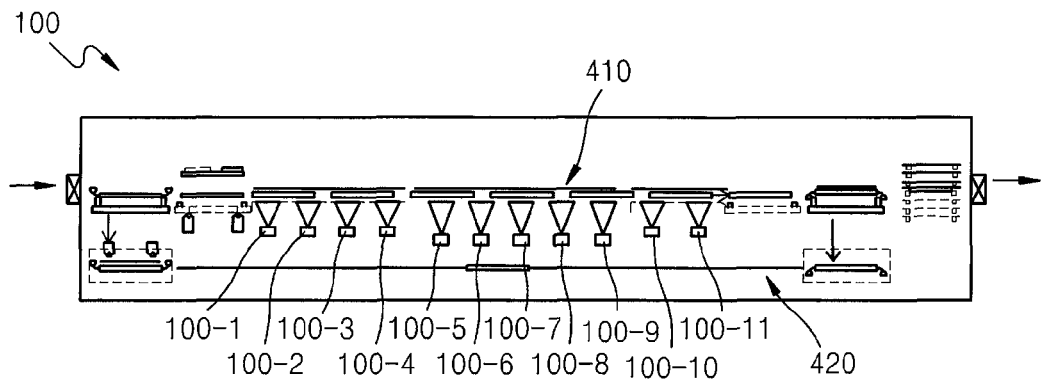
FIG. 2 is a schematic side view of a deposition unit of the organic layer deposition apparatus shown in FIG. 1.

FIG. 1 is a schematic plan view of an organic layer deposition apparatus 1, according to an embodiment of the present invention. FIG. 2 is a schematic side view of a deposition unit of the organic layer deposition apparatus 1 shown in FIG. 1.

Referring to FIGS. 1 and 2, the organic layer deposition apparatus 1 includes a deposition unit 100, a loading unit 200, an unloading unit 300, and a conveyer unit 400.

The loading unit 200 may include a first rack 212, an induction chamber 214, a first inversion chamber 218, and a buffer chamber 219.

A plurality of substrates 2 to which deposition has not been performed are loaded in the first rack 212. An induction robot disposed in the induction chamber 214 holds the substrates 2 transferred from the first rack 212, puts the substrates 2 on a transfer unit 430 transferred from a second conveyer unit 420 (shown in FIG. 2), and moves the transfer unit 430 onto which the substrates 2 are adhered, to the first inversion chamber 218.

The first inversion chamber 218 is disposed adjacent to the induction chamber 214. A first inversion robot disposed in the first inversion chamber 218 inverts the transfer unit 430 and places the transfer unit 430 in a first conveyer unit 410 (shown in FIG. 2) of the deposition unit 100.

Referring to FIG. 1, the induction robot of the induction chamber 214 puts the substrates 2 on the transfer unit 430. In this state, the transfer unit 430 is transferred to the first inversion chamber 218, and the first inversion robot of the first inversion chamber 218 inverts the transfer unit 430, so that the substrates 2 face down in the deposition unit 100.

The unloading unit 300 is configured in a reverse way to the loading unit 200. In other words, a second inversion robot inverts the substrates 2 and the transfer unit 430 that have passed through the deposition unit 100, in a second inversion chamber 328, and transfers the substrates 2 and the transfer unit 430 to a carry-out chamber 324. A carry-out robot takes the substrates 2 and the transfer unit 430 out of the carry-out chamber 324, separates the substrates 2 from the transfer unit 430, and loads the substrates 2 in a second rack 322. The transfer unit 430 separated from the substrates 2, is returned to the loading unit 200 via the second conveyer unit 420.

However, the present invention is not limited thereto. Thus, from when the substrates 2 are initially fixed to the respective transfer units 430, the substrates 2 may be fixed to a bottom surface of the respective transfer units 430 so as to be transferred to the deposition unit 100. In this case, the first inversion robot of the first inversion chamber 218 and the second inversion robot of the second inversion chamber 328 may be omitted.

The deposition unit 100 includes at least one chamber 101 for deposition. Referring to FIGS. 1 and 2, the deposition unit 100 includes one chamber 101, and a plurality of organic layer deposition assemblies 100-1 to 100-11 are located inside the chamber 101. Referring to FIG. 1, eleven organic layer deposition assemblies, that is, a first organic layer deposition assembly 100-1 to an eleventh organic layer deposition assembly 100-11, are disposed inside the chamber 101, but the number of organic layer deposition assemblies may vary according to deposition materials and deposition conditions. The chamber 101 is maintained at a vacuum state during the deposition.

Referring to FIG. 1, the transfer units 430 to which the substrates 2 are respectively fixed are moved by the first conveyer unit 410 to at least the deposition unit 100, and preferably, sequentially moved to the loading unit 200, the deposition unit 100, and the unloading unit 300. The transfer units 430 separated from the substrates 2 in the unloading unit 300 are returned to the loading unit 200 by the second inversion chamber 328.

The first conveyer unit 410 is configured to pass through the chamber 101, and the second conveyer unit 420 is disposed to transfer the transfer units 430 separated from the substrates 2.

Here, in the organic layer deposition apparatus 1, the first conveyer unit 410 and the second conveyer unit 420 are formed at upper and lower sides, respectively, so that the transfer units 430, on which deposition is performed while passing through the first conveyer unit 410, are separated from the substrates 2 in the unloading unit 300 and are then returned to the loading unit 200 via the second conveyer unit 420 formed below the first conveyer unit 410, thereby enhancing use of space.

The deposition unit 100 shown in FIG. 1 may further include a deposition source replacing unit 190 at one side of the organic layer deposition assembly 100-1. Although not shown in FIGS. 1 and 2, the deposition source replacing unit 190 may be formed as a cassette type unit so as to be carried to the outside from the organic layer deposition assembly 100-1. Thus, a deposition source 110 (see FIG. 3) of the organic layer deposition assembly 100-1 may be easily replaced.

FIG. 1 shows a set of two organic layer deposition apparatuses 1 that are arranged in series, wherein the organic layer deposition apparatuses 1 each include the loading unit 200, the deposition unit 100, the unloading unit 300, and the conveyer unit 400. In other words, it may be understood that two organic layer deposition apparatuses 1 are disposed at upper and lower sides, respectively, as shown in FIG. 2. In this case, a patterning slit sheet replacing unit 500 may further be disposed between the two organic layer deposition apparatuses 1. In other words, the patterning slit sheet replacing unit 500 may be disposed between the two organic layer deposition apparatuses 1 so that the two organic layer deposition apparatuses 1 share the patterning slit sheet replacing unit 500, which is a better use of space compared to a case where each of the two organic layer deposition apparatuses 1 includes the patterning slit sheet replacing unit 500.

Figure 3:
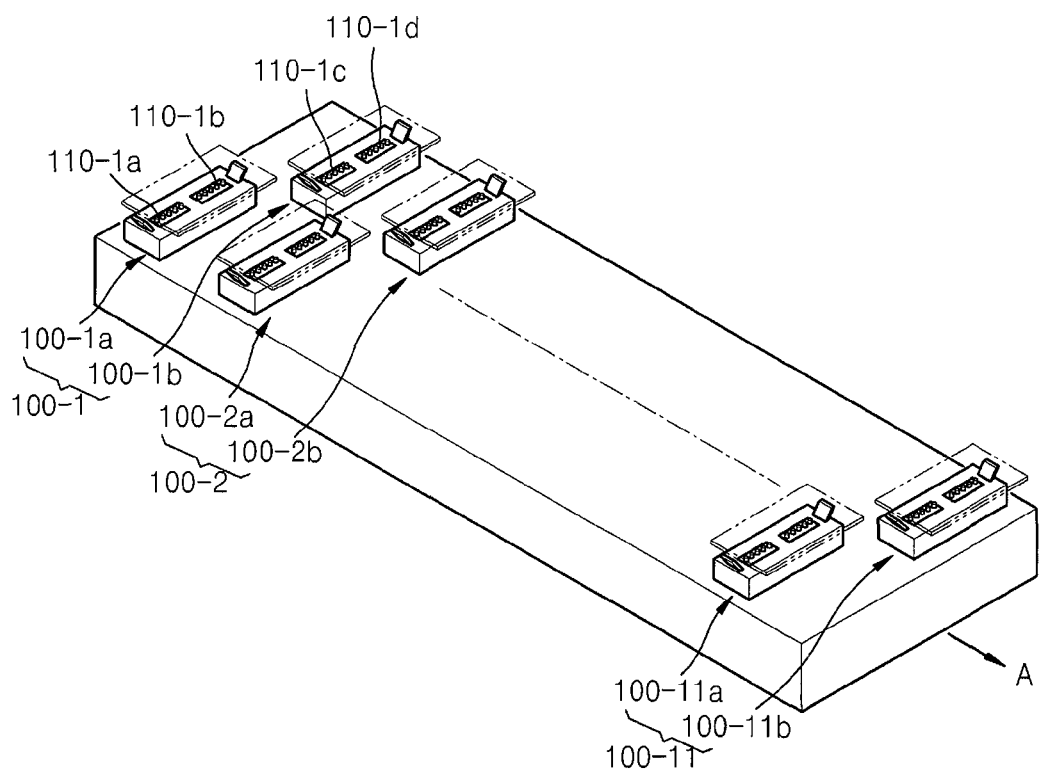
FIG. 3 is a schematic perspective view of an organic layer deposition assembly including an organic layer deposition unit, according to an embodiment of the present invention.
Figure 4:
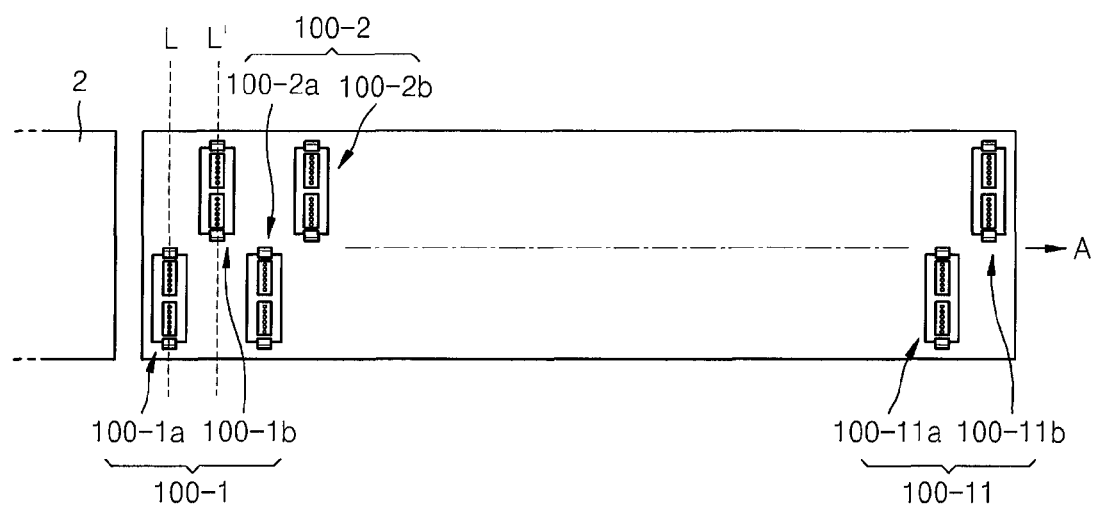
FIG. 4 is a schematic plan view of one of the organic layer deposition assemblies shown in FIG. 3.
Figure 5:
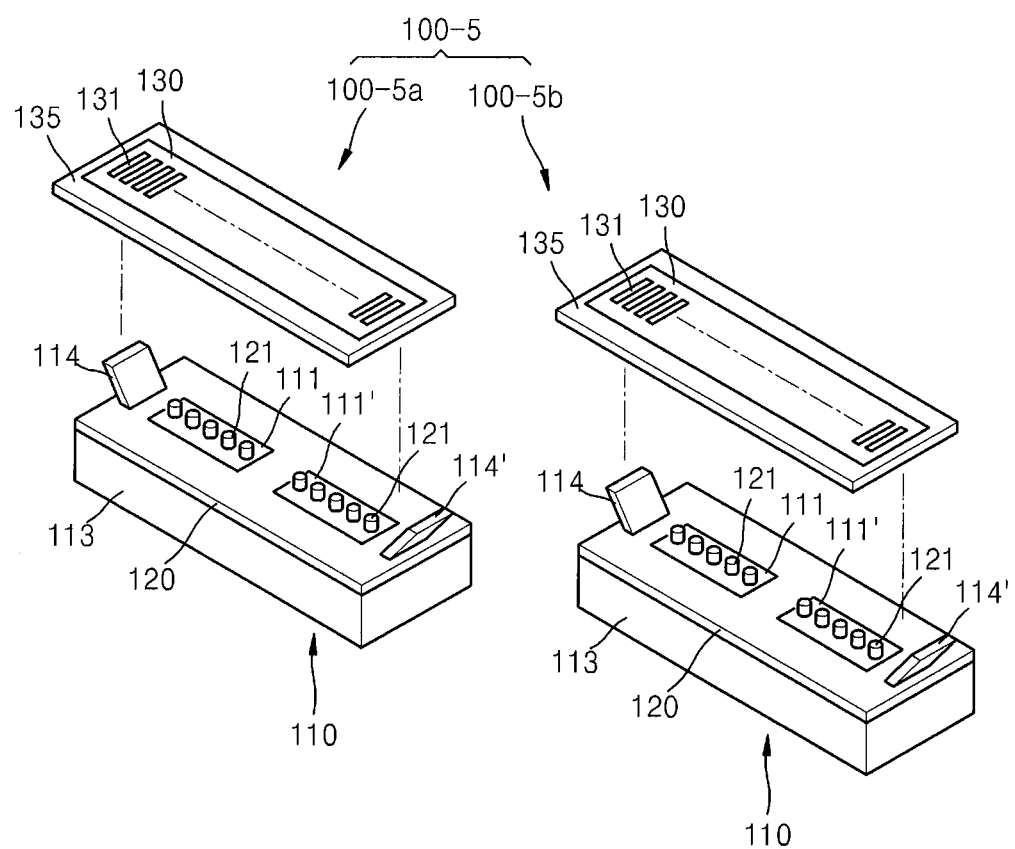
FIG. 5 is a schematic perspective view of an organic layer deposition assembly including a first organic layer deposition unit and a second organic layer deposition unit, according to an embodiment of the present invention.

FIG. 3 is a schematic perspective view of an organic layer deposition assembly including an organic layer deposition unit, according to an embodiment of the present invention. FIG. 4 is a schematic plan view of the organic layer deposition assembly shown in FIG. 3. FIG. 5 is a schematic perspective view of an organic layer deposition assembly including a first organic layer deposition unit and a second organic layer deposition unit, according to an embodiment of the present invention.

Referring to FIGS. 3 to 5, the organic layer deposition apparatus 1 may include eleven organic layer deposition assemblies 100-1 to 100-11. However, the present invention is not limited thereto, and the organic layer deposition apparatus 1 may include a greater number of organic layer deposition assemblies.

Among the organic layer deposition assemblies 100-1 to 100-11, the organic layer deposition assemblies 100-1, 100-2, 100-3, 100-4, 100-5, 100-10, and 100-11 may form a common layer of an organic layer 63 (see FIG. 13), and the rest of organic layer deposition assemblies, that is, the organic layer deposition assemblies 100-6, 100-7, 100-8, and 100-9, may form layers, which are patterned for each sub-pixel, on the organic layer 63.

For example, a deposition source of the organic layer deposition assembly 100-1 may include a deposition material for forming a hole injection layer; a deposition source of the organic layer deposition assembly 100-2 may include a deposition material for forming an interlayer (IL); a deposition source of the organic layer deposition assembly 100-3 may include a deposition material for forming a hole transport layer; and a deposition source of the organic layer deposition assembly 100-4 may include a deposition material for forming a hole injection layer. Also, a deposition source of the organic layer deposition assembly 100-10 may include a deposition material for forming an electron transport layer; and a deposition source of the organic layer deposition assembly 100-11 may include a deposition material for forming an electron injection layer.

Deposited layers formed by the organic layer deposition assemblies 100-1, 100-2, 100-3, 100-4, 100-5, 100-10, and 100-11 may be formed in common irrespective of sub-pixels. Accordingly, a patterning slit sheet, that is, an open mask, in which one patterning slit is formed may be disposed on the organic layer deposition assemblies 100-1, 100-2, 100-3, 100-4, 100-5, 100-10, and 100-11.

The organic layer deposition assemblies 100-5, 100-6, 100-7, 100-8, and 100-9 may form layers that are patterned for each sub-pixel on the organic layer 63. In other words, a deposition source of the organic layer deposition assembly 100-5 may include a deposition material for forming an auxiliary layer of red and green sub-pixels, a deposition source of the organic layer deposition assembly 100-6 may include a deposition material for forming an auxiliary layer of a red sub-pixel, a deposition source of the organic layer deposition assembly 100-7 may include a deposition material for forming a red emission layer, a deposition source of the organic layer deposition assembly 100-8 may include a deposition material for forming a green emission layer, and a deposition source of the organic layer deposition assembly 100-9 may include a deposition material for forming a blue emission layer.

Accordingly, a patterning slit sheet 130 in which a plurality of patterning slits 131 are formed may be disposed on the deposition sources of the organic layer deposition assemblies 100-5, 100-6, 100-7, 100-8, and 100-9.

The present invention is not limited thereto. The organic layer deposition apparatus 1 according to an embodiment of the present invention may include at least two organic layer deposition assemblies, and each organic layer deposition assembly may include at least one deposition source. In addition, a deposition source may include various kinds of deposition materials according to a structure of an organic layer deposition assembly.

The organic layer deposition assemblies 100-1 to 100-11 may include first organic layer deposition units 100-1a to 100-11a and second organic layer deposition units 100-1b to 100-11b, respectively.

For the first organic layer deposition units 100-1a to 100-11a and the second organic layer deposition units 100-1b to 100-11b, a virtual line extending from the first organic layer deposition units 100-1a to 100-11a in a longitudinal direction L and a virtual line extending from the second organic layer deposition units 100-1b to 100-11b in a longitudinal direction L' may be parallel to each other. In other words, the first organic layer deposition units 100-1a to 100-11a and the second organic layer deposition units 100-1b to 100-11b are arranged so as to not overlap each other on the longitudinal directions L or L'. As shown in FIGS. 3 and 4, the first organic layer deposition units 100-1a to 100-11a and the second organic layer deposition units 100-1b to 100-11b may be disposed to be misaligned with respect to (or offset from) each other along a direction A shown in FIGS. 3 and 4.

Also, the first organic layer deposition units 100-1a to 100-11a may be arranged separately from one another in a row in the direction A perpendicular to the longitudinal direction L, and the second organic layer deposition units 100-1b to 100-11b may be arranged separately from one another in a row in the direction A perpendicular to the longitudinal direction L'. Here, a perpendicular direction to the longitudinal directions L and L' is a direction in which the substrates 2 are transferred.

However, as shown in FIG. 4, the first organic layer deposition units 100-1a to 100-11a and the second organic layer deposition units 100-1b to 100-11b may be disposed not to be superposed (or overlapped) with each other in the direction A perpendicular to the longitudinal directions L and L'.

As shown in FIG. 5, a second sensor 114' of the first organic layer deposition unit 100-5a is disposed to be spaced apart from a first sensor 114 of the second organic layer deposition unit 100-5b and to be misaligned to (or offset from) each other in the longitudinal direction L or L', and thus the second sensor 114' is not interfered by the first sensor 114.

Also, the first organic layer deposition units 100-1a to 100-11a and the second organic layer deposition units 100-1b to 100-11b are disposed not to be on the longitudinal directions L or L' so that the first organic layer deposition units 100-1a to 100-11a and the second organic layer deposition units 100-1b to 100-11b may be disposed not to be superposed with each other in the direction A perpendicular to the longitudinal directions L and L', thereby reducing a manufacturing time and a manufacturing cost in manufacturing an organic light-emitting display apparatus by using the substrates 2 having a size equal to or greater than an 8 G size (2200 mm×2500 mm). For example, when an organic light-emitting display apparatus is manufactured using an organic layer deposition apparatus according to an embodiment of the present invention, a deposition source, which includes a deposition material that is deposited onto a substrate while the substrate relatively moves with respect to the organic layer deposition apparatus, wherein the deposition source has a length corresponding to a length of one side of the substrate, is used. Also, because a large-size substrate is used in order to improve productivity of the organic light-emitting display apparatus, as a size of the substrate increases, a size of the deposition source needs to increase. As the size of the deposition source increases, a length of a heater frame, as well as a length of a crucible constituting the deposition source, increases. Also, as a length of the deposition source increases, the deposition source becomes vulnerable to thermal deformation, and it becomes difficult to maintain a temperature of the entire deposition source constant, thereby affecting a uniformity of an organic layer deposited onto the substrate.

However, in the organic layer deposition apparatus according to an embodiment of the present invention, because the organic layer deposition assemblies 100-1 to 100-11 respectively include the first organic layer deposition units 100-1a to 100-11a and the second organic layer deposition units 100-1b to 100-11b having a size that is smaller than a length of one side of the substrate 2 and may maintain a temperature of the entire deposition source 110 uniform within a predetermined range, even in the case of an organic light-emitting display apparatus using a large-size substrate having a size equal to or greater than an 8 G size (2200 mm×2500 mm), a thickness of an organic layer may be prevented from being non-uniform due to thermal deformation of the deposition source 110 or temperature non-uniformity of the entire deposition source 110.

Also, in the organic layer deposition apparatus according to an embodiment of the present invention, the organic layer deposition assemblies 100-1 to 100-11 respectively include the first organic layer deposition units 100-1a to 100-11a and the second organic layer deposition units 100-1b to 100-11b having a size that is smaller than a length of one side of the substrate 2, and thus the cost and time for developing an additional deposition source corresponding to a large-size substrate may be reduced.

FIG. 5 is a schematic perspective view of the organic layer deposition assembly 100-5 including the first organic layer deposition unit 100-5a and the second organic layer deposition unit 100-5b, according to an embodiment of the present invention.

Referring to FIG. 5, the organic layer deposition assembly 100-5 may include the first organic layer deposition unit 100-5a and the second organic layer deposition unit 100-5b. Each of the first organic layer deposition unit 100-5a and the second organic layer deposition unit 100-5b may include the deposition source 110, a deposition source nozzle unit 120, the patterning slit sheet 130, a frame 135, the first sensor 114, the second sensor 114', and the like. Here, all the components shown in FIGS. 3 to 5 may be disposed inside the chamber 101 that maintains an appropriate vacuum level in order to secure directivity of the deposition material.

For example, in order for the deposition material (not shown) discharged from the deposition source 110 to be deposited onto the substrate 2 in a desired pattern via the deposition source nozzle unit 120 and the patterning slit sheet 130, the inside of the chamber (not shown) basically needs to maintain a high vacuum level similar to a method of depositing a fine metal mask (FMM). Also, a temperature of the patterning slit sheet 130 should be sufficiently lower than that of the deposition source 110 in order to reduce or minimize thermal expansion of the patterning slit sheet 130 due to the temperature of the patterning slit sheet 130.

The substrate 2, on which deposition is to be performed, is disposed inside the chamber 101. The substrate 2 may be a substrate for a flat panel display device, and may be configured as a large-size substrate having a size equal to or greater than 40 inches, for example, a mother glass with which a plurality of flat panel display devices may be formed.

Here, in an embodiment of the present invention, deposition is performed on the substrate 2 while the substrate 2 relatively moves with respect to the organic layer deposition assemblies 100-1 to 100-11.

For example, in a conventional FMM depositing method, the FMM and a substrate typically have the same size. Accordingly, as the size of the substrate increases, the size of the FMM is increased, and thus it is difficult to manufacture the FMM, and it is also difficult to extend the FMM and align the FMM in a precise pattern.

In order to solve the problem, the organic layer deposition assemblies 100-1 to 100-11 according to an embodiment of the present invention and the substrate 2 relatively move with respect to each other to perform deposition. In other words, deposition is successively performed on the substrate 2 disposed to face the organic layer deposition assemblies 100-1 to 100-11 while the substrate 2 moves in a Y-axis direction. That is, deposition is performed on the substrate 2 in a scanning manner while the substrate 2 moves in a direction of an arrow 'A' shown in FIG. 3. Here, although FIG. 3 shows that deposition is performed on the substrate 2 while the substrate 2 moves in the Y-axis direction in the chamber (not shown), the present invention is not limited thereto. However, alternatively, the substrate 2 may be fixed, and the organic layer deposition assembly 100-1 may perform deposition on the substrate 2 while the organic layer deposition assembly 100-1 moves in the Y-axis direction.

Accordingly, in the organic layer deposition assemblies 100-1 to 100-11 according to an embodiment of the present invention, the patterning slit sheet 130 may be formed to be smaller than a conventional FMM for deposition on a comparably sized substrate.

In other words, in the organic layer deposition assemblies 100-1 to 100-11 of the present invention, because deposition is successively performed on the substrate 2 in a scanning manner while the substrate 2 moves in the Y-axis direction, at least one of the lengths of the patterning slit sheet 130 in an X-axis direction and the Y-axis direction may be formed to be smaller than the length of the substrate 2. As such, in the organic layer deposition assemblies 100-1 to 100-11 according to an embodiment of the present invention, the patterning slit sheet 130 may be formed to be smaller than that in the conventional FMM for performing deposition on a comparably sized substrate, and thus the patterning slit sheet 130 may be easily manufactured. In other words, the patterning slit sheet 130 having a small size is desirable or advantageous, compared to the conventional deposition method of an FMM, in all processes including an etching process of the patterning slit sheet 130 and precision extending, welding, transferring, and washing processes after the etching process of the patterning slit sheet 130. Also, as a display apparatus is becoming larger, the patterning slit sheet 130 having a small size is further desirable or advantageous.

As such, in order for the organic layer deposition assemblies 100-1 to 100-11 and the substrate 2 to perform deposition while the organic layer deposition assemblies and the substrate 2 are relatively moving with respect to each other, the organic layer deposition assemblies 100-1 to 100-11 and the substrate 2 may be spaced apart from each other at a gap or an interval (e.g., a predetermined interval), which will be described later in detail.

The deposition source 110, in which the deposition material is accommodated and heated, is disposed inside the chamber to be opposite to the substrate 2. As the deposition material accommodated in the deposition source 110 is vaporized, deposition is performed on the substrate 2.

For example, the deposition source 110 may include first and second crucibles 111 and 111' filled with the deposition material, first and second heaters (not shown) for heating the first and second crucibles 111 and 111' to vaporize the deposition material filled in the first and second crucibles 111 and 111' toward one side of the first and second crucibles 111 and 111', for example, toward the deposition source nozzle unit 120, a cooling housing 113 that surrounds the first and second heaters and prevents (or substantially prevents) heat generated by the first and second heaters from being discharged out of the deposition source 110, and the first and second sensors 114 and 114' for measuring an amount of the deposition material that is vaporized in the first and second crucibles 111 and 111'.

The deposition source nozzle unit 120 is disposed at one side of the deposition source 110, for example, at a portion of the deposition source 110 facing the substrate 2. Here, in an organic layer deposition assembly according to an embodiment of the present invention, a plurality of the deposition source nozzle units 120 may be formed in different ways to deposit a common layer and a patterned layer. In other words, although not shown in the drawing, a plurality of deposition source nozzles 121 may be formed in the deposition source nozzle units 120 for forming the patterning layer in the Y-axis direction, that is, in a direction in which the substrate 2 is scanned. Accordingly, only one deposition source nozzle 121 may be formed in the X-axis direction so as to greatly decrease generation of a shadow. A plurality of deposition source nozzles 121 may be formed in the deposition source nozzle unit 120 for forming the common layer in the X-axis direction, thereby improving uniformity of a thickness of the common layer.

The patterning slit sheet 130 may further be disposed between the deposition source 110 and the substrate 2. The patterning slit sheet 130 may further include the frame 135 formed to have a window frame shape, and the plurality of patterning slits 131 are formed in the patterning slit sheet 130 in the X-axis direction. The deposition material vaporized inside the deposition source 110 passes through the deposition source nozzle unit 120 and the patterning slit sheet 130 toward the substrate 2 on which deposition is to be performed. Here, the patterning slit sheet 130 may be manufactured by etching, which is the same method as a method of manufacturing the conventional FMM, in particular, a stripe type mask. The number of deposition source nozzles 121 may be less than the number of patterning slits 131.

In this regard, the above-described deposition source 110 (and the deposition source nozzle unit 120 coupled to the deposition source 110) and the patterning slit sheet 130 may be formed spaced apart from each other at an interval (e.g. a predetermined interval).

As described above, the organic layer deposition assembly 100-5 according to an embodiment of the present invention performs deposition while relatively moving with respect to the substrate 2. As such, in order for the organic layer deposition assembly 100-5 to relatively move with respect to the substrate 2, the patterning slit sheet 130 is formed to be spaced apart from the substrate 2 at an interval or gap (e.g., a predetermined interval).

For example, in the conventional FMM depositing method, deposition is performed by tightly adhering a mask to a substrate in order to prevent a shadow from being generated on the substrate. However, when the mask is tightly adhered to the substrate, defects due to contact between the substrate and the mask may occur. Also, since the mask may not be moved with respect to the substrate, the mask is formed to have substantially the same size as the substrate. Accordingly, as a size of a display apparatus increases, the size of the mask is increased. However, there is a problem that it is difficult to form such a large-size mask.

In order to solve the problem, in the organic layer deposition assembly 100-1 according to an embodiment of the present invention, the patterning slit sheet 130 is disposed to be spaced apart from the substrate 2, on which deposition is to be performed, at a gap or an interval (e.g., a predetermined interval).

After the mask is formed to be smaller than the substrate 2, deposition is performed while moving the mask with respect to the substrate 2, thereby facilitating the manufacture of the mask and preventing generation of defects due to contact between the substrate 2 and the mask. Also, there is no time required to tightly adhere the substrate 2 to the mask, and thus a manufacturing time may be shortened.

The deposition source 110 of each of the first and second organic layer deposition units 100-5a and 100-5b may include the first and second crucibles 111 and 111'. The first and second crucibles 111 and 111' may be disposed in the longitudinal direction L or L' of the deposition source 110.

The first sensor 114 and the second sensor 114' may be located at two respective ends of the deposition source 110 in the longitudinal direction L or L' of the deposition source 110 to face each other. The first sensor 114 may measure an amount of deposition material discharged from the first crucible 111, and the second sensor 114' may measure an amount of deposition material discharged from the second crucible 111'.

As described above, the first organic layer deposition unit 100-5a and the second organic layer deposition unit 100-5b are not located on their own extending lines in the longitudinal directions L and L', and the first organic layer deposition unit 100-5a and the second organic layer deposition unit 100-5b are disposed not to be superposed with each other in a direction A perpendicular to the longitudinal directions L and L'. Thus, the second sensor 114' of the first organic layer deposition unit 100-5a is disposed to be spaced apart from and misaligned to (or offset from) the first sensor 114 of the second organic layer deposition unit 100-5b in the longitudinal direction L or L'. Accordingly, the second sensor 114' of the first organic layer deposition unit 100-5a and the first sensor 114 of the second organic layer deposition unit 100-5b do not interfere with each other.

Figure 6:
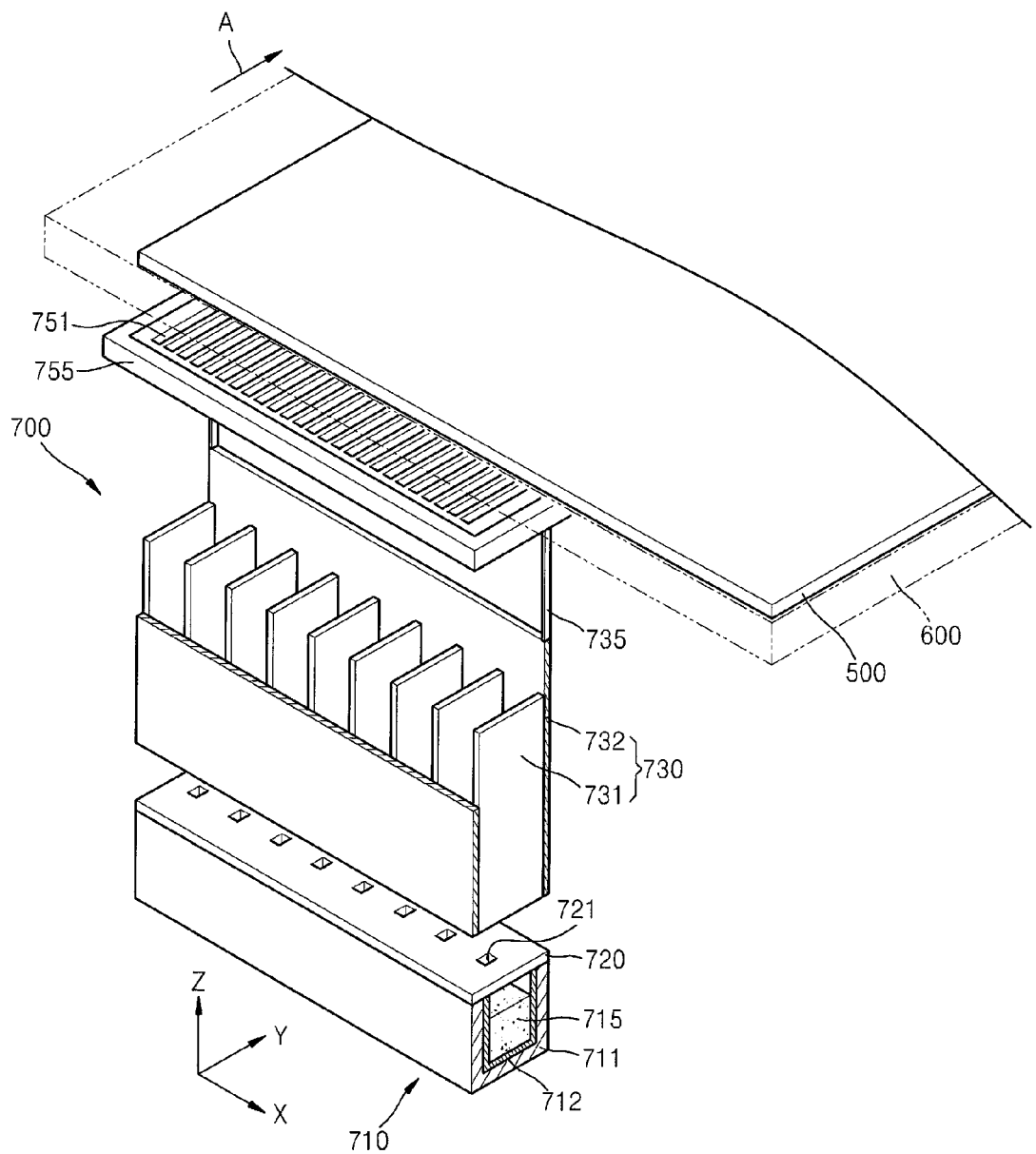
FIG. 6 is a schematic perspective view showing an organic layer deposition assembly according to another embodiment of the present invention.
Figure 7:
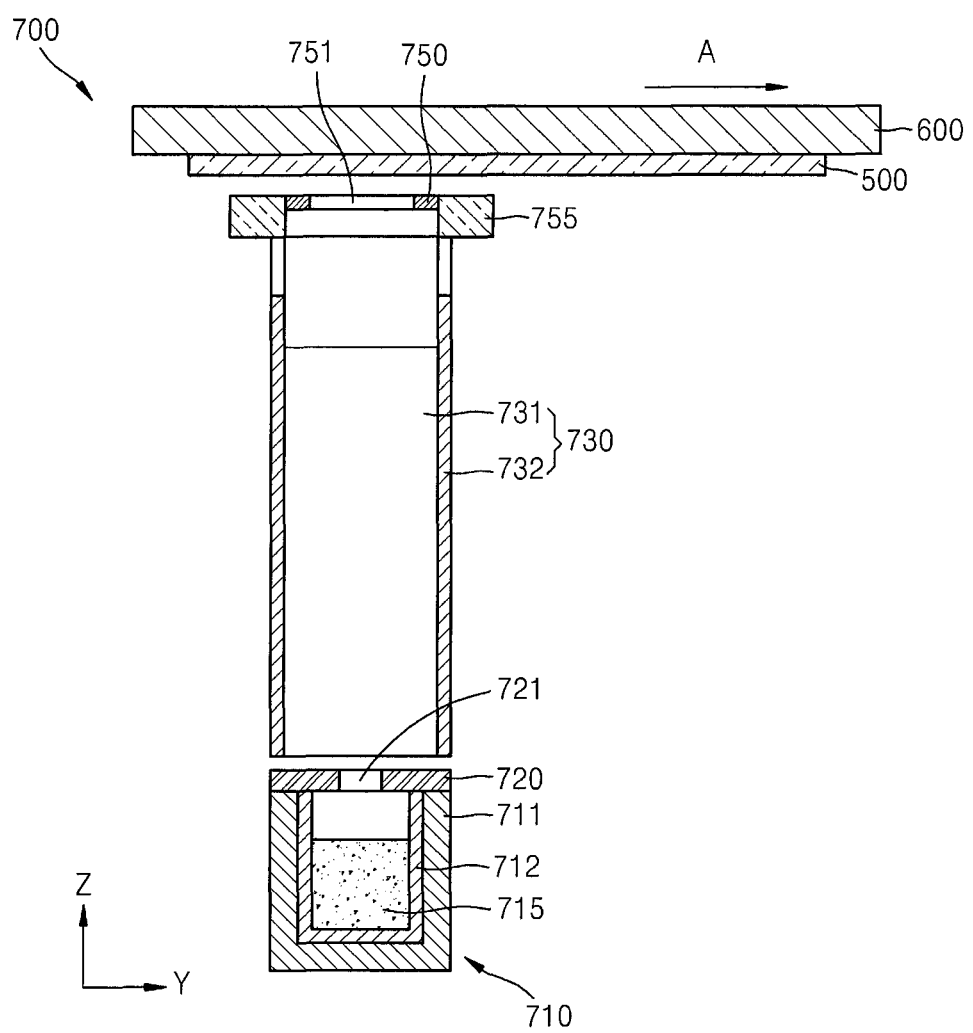
FIG. 7 is a schematic cross-sectional side view of the organic layer deposition assembly shown in FIG. 6.
Figure 8:
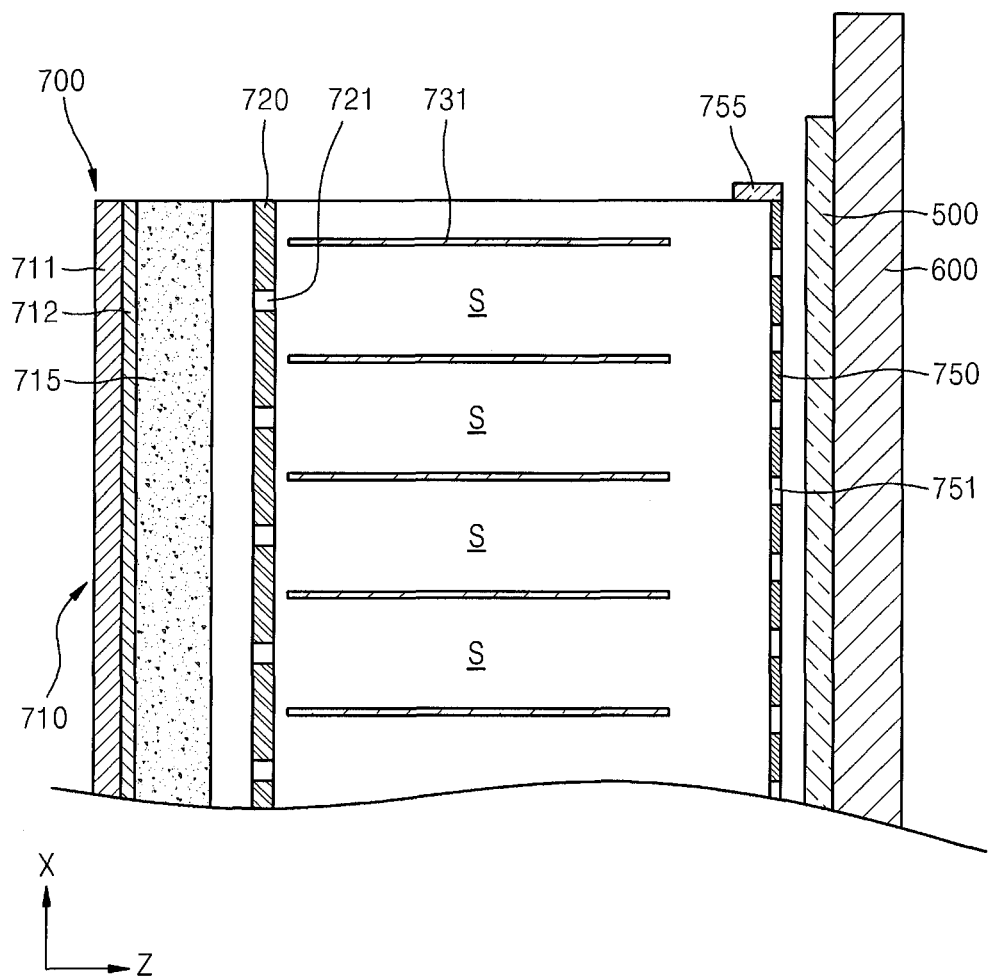
FIG. 8 is a schematic cross-sectional plan view of the organic layer deposition assembly shown in FIG. 6.

FIG. 6 is a view schematically showing an organic layer deposition assembly 700 according to another embodiment of the present invention. FIG. 7 is a schematic cross-sectional side view of the organic layer deposition assembly 700 shown in FIG. 6. FIG. 8 is a schematic cross-sectional plan view of the organic layer deposition assembly 700 shown in FIG. 6.

Referring to FIGS. 6 to 8, the organic layer deposition assembly 700 includes a deposition source 710, a deposition source nozzle unit 720, a blocking plate assembly 730, and a patterning slit sheet 750.

Here, the deposition source 710 includes a crucible 711 to be filled with a deposition material 715, and a heater 712 for heating the crucible 711 to vaporize the deposition material 715 filled in the crucible 711 toward the deposition source nozzle unit 720. The deposition source nozzle unit 720 is disposed at one side of the deposition source 710, and a plurality of deposition source nozzles 721 are formed in the deposition source nozzle unit 720 along an X-axis direction.

The blocking plate assembly (or a barrier plate assembly) 730 is disposed at one side of the deposition source nozzle unit 720. The blocking plate assembly 730 includes a plurality of blocking plates (or barrier plates) 731 and a blocking plate frame (or a barrier plate frame) 732 disposed outside of the blocking plates 731. The blocking plates 731 may be disposed in parallel to each other along the X-axis direction. Here, the blocking plates 731 may be disposed at equal intervals. Also, the blocking plates 731 may extend parallel to a Y-Z plane as shown in FIG. 6, and for example, may be formed in a rectangular shape. The blocking plates 731 disposed in such a way divide a space between the deposition source nozzle unit 720 and a patterning slit 751 into a plurality of deposition spaces S. In other words, in the organic layer deposition assembly 700 according to an embodiment of the present invention, the deposition spaces S are defined by the blocking plates 731, as shown in FIG. 8, according to the deposition source nozzles 721 through which the deposition material is sprayed. As such, the blocking plates 731 may divide a space between the deposition source nozzle unit 720 and the patterning slit sheet 750 into the plurality of deposition spaces S so that the deposition material discharged from one deposition source nozzle 721 may not be mixed with the deposition materials discharged from other deposition source nozzles 721 and may be deposited onto the substrate 2 via the patterning slit 751. In other words, the blocking plates 731 may guide a transfer path of the deposition material so that the deposition material discharged through the deposition source nozzle 721 may not disperse and move straight in the Z-axis direction.

As such, straightness of the deposition material may be secured by including the blocking plates 731, thereby reducing (e.g., greatly reducing) sizes of shadows formed in the substrate 2. Accordingly, the organic layer deposition assembly 700 and the substrate 2 may be spaced apart from each other at a gap or an interval (e.g., a predetermined interval).

The patterning slit sheet 750 may further be disposed between the deposition source 710 and the substrate 2. The patterning slit sheet 750 may further include a frame 755 that is substantially formed in a window frame shape. The plurality of patterning slits 751 are formed in the patterning slit sheet 750 along the X-axis direction. The deposition material 715 vaporized inside the deposition source 710 moves toward the substrate 2 to be deposited via the deposition source nozzle unit 720 and the patterning slit sheet 750.

Figure 9:
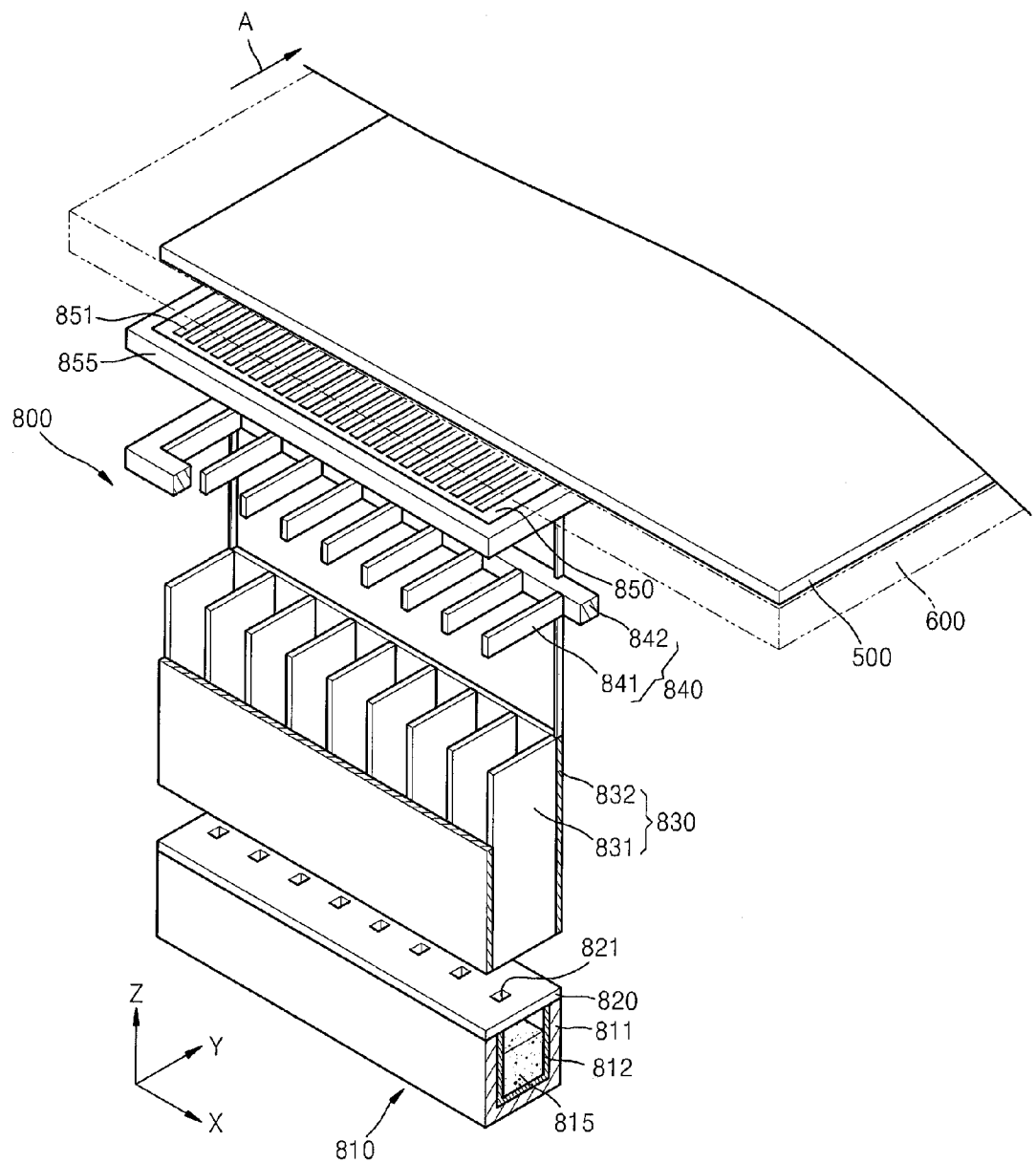
FIG. 9 is a schematic perspective view showing an organic layer deposition assembly according to another embodiment of the present invention.

FIG. 9 is a view schematically showing an organic layer deposition assembly 800 according to another embodiment of the present invention.

The organic layer deposition assembly 800 includes a deposition source 810, a deposition source nozzle unit 820, a first blocking plate assembly (or a first barrier plate assembly) 830, a second blocking plate assembly (or a second barrier plate assembly) 840, and a patterning slit sheet 850. Here, detailed configurations of the deposition source 810, the first blocking plate assembly 830, and the patterning slit sheet 850 are substantially the same as those described with reference to FIG. 8, and thus a detailed description thereof is omitted. The current embodiment is different from the above-described embodiments in that the second blocking plate assembly 840 is disposed at one side of the first blocking plate assembly 830.

In detail, the second blocking plate assembly 840 includes a plurality of second blocking plates 841 and a second blocking plate frame 842 that is disposed outside of (or external to) the second blocking plates 841. The second blocking plates 841 may be disposed in parallel to each other along an X-axis direction. The second blocking plates 841 may be disposed at equal intervals. Also, the second blocking plates 841 may be formed to be parallel to a Y-Z plane, as shown in FIG. 9, that is, to be perpendicular to the X-axis direction.

First blocking plates 831 and the second blocking plates 841 that are disposed in such a way divide a space between the deposition source nozzle unit 820 and the patterning slit sheet 850. In other words, deposition spaces are defined by the first blocking plates 831 and the second blocking plates 841 according to deposition source nozzles 821 through which a deposition material is sprayed.

Here, the second blocking plates 841 may be disposed to correspond one-to-one to the first blocking plates 831. In other words, the second blocking plates 841 are aligned with the first blocking plates 831 and disposed parallel to each other. That is, the first blocking plates 831 and the second blocking plates 841 that correspond to each other are located on the same plane. Although FIG. 9 shows that the first blocking plates 831 have a length that is substantially the same as a width of the second blocking plate 841 in the X-axis direction, the present invention is not limited thereto. In other words, the second blocking plates 841 required to be precisely aligned with the patterning slits 851 may be formed relatively thin, while the first blocking plates 831 not required to be precisely aligned may be formed relatively thick, thereby facilitating the manufacture of the organic layer deposition assembly 800.

Figure 10:
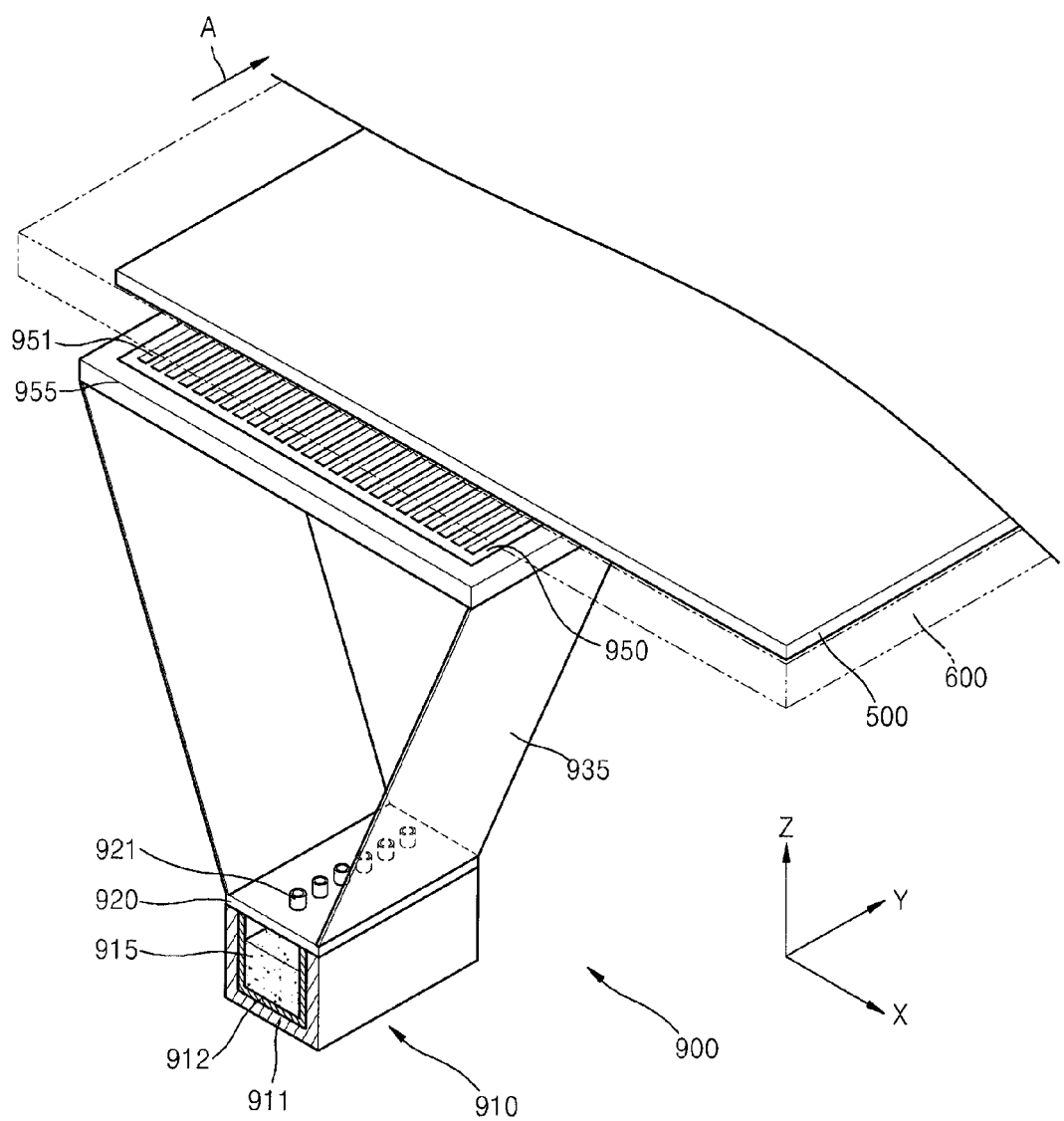
FIG. 10 is a schematic perspective view showing an organic layer deposition assembly according to another embodiment of the present invention.

FIG. 10 is a view schematically showing an organic layer deposition assembly 900 according to another embodiment of the present invention.

Referring to FIG. 10, the organic layer deposition assembly 900 includes a deposition source 910, a deposition source nozzle unit 920, and a patterning slit sheet 950.

Here, the deposition source 910 includes a crucible 911 to be filled with a deposition material 915, and a heater 912 for heating the crucible 911 to vaporize the deposition material 915 filled in the crucible 911 toward the deposition source nozzle unit 920. The deposition source nozzle unit 920 is disposed at one side of the deposition source 910, and a plurality of deposition source nozzles 921 are formed on the deposition source nozzle unit 920 in a Y-axis direction. The patterning slit sheet 950 and a frame 955 are further located between the deposition source 910 and the substrate 2, and a plurality of patterning slits 951 are formed in the patterning slit sheet 950 along the X-axis direction. The deposition source 910, the deposition source nozzle unit 920, and the patterning slit sheet 950 are coupled to each other via a connection member 935.

The current embodiment is different from the above-described embodiments in the arrangement of the deposition source nozzles 921, which will be described later in detail.

The deposition source nozzle unit 920 is located at one side of the deposition source 910, for example, at a portion of the deposition source 910 facing the substrate 2. The plurality of deposition source nozzles 921 are formed on the deposition source nozzle unit 920 along the Y-axis direction, that is, in a direction in which the substrate 2 is scanned. Here, the deposition source nozzles 921 may be formed at equal intervals. The deposition material 915 vaporized inside the deposition source 910 passes through the deposition source nozzle unit 920 and moves toward the substrate 2 to be deposited. Consequently, the plurality of deposition source nozzles 921 are formed in one organic layer deposition assembly 900-1 along a direction in which the substrate 2 is scanned. In this case, if there are a plurality of deposition source nozzles 921 along the X-axis direction, a distance between the deposition source nozzle 921 and the patterning slit 951 varies, and thus shadows may be generated due to the deposition material discharged from the deposition source nozzle 921 that is disposed far away from the patterning slit 951. Accordingly, the deposition source nozzle 921 is formed in such a way that only one deposition source nozzle 921 is disposed along the X-axis direction, thereby greatly decreasing generation of shadows. Also, since the plurality of deposition source nozzles 921 are disposed in a direction in which the substrate 2 is scanned, even if a flux difference between individual deposition source nozzles 921 is generated, the flux difference is offset, and thus deposition uniformity may be maintained substantially constant.

Hereinafter, a configuration of an organic layer formed by an organic layer deposition apparatus according to an embodiment of the present invention will be described in detail.

Figure 11:
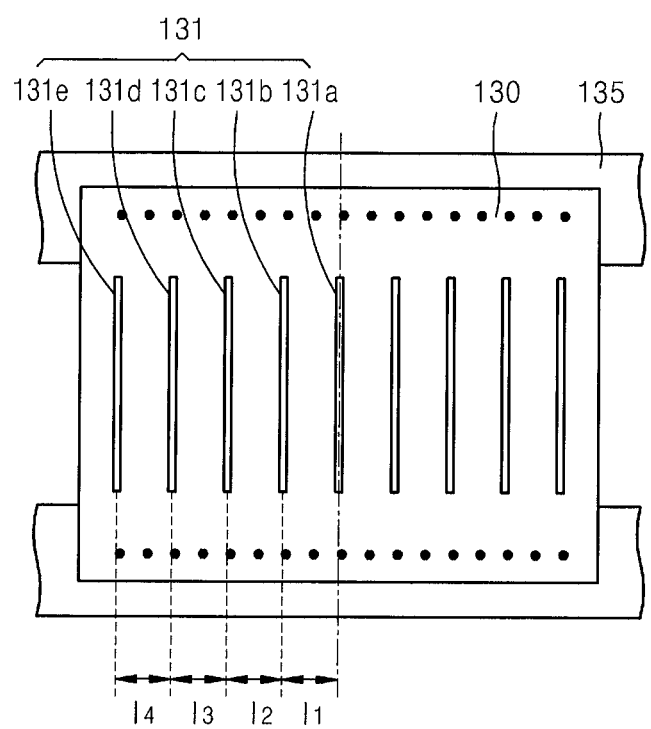
FIG. 11 schematically shows patterning slits that are formed at equal intervals in a patterning slit sheet of an organic layer deposition apparatus, according to an embodiment of the present invention.
Figure 12:
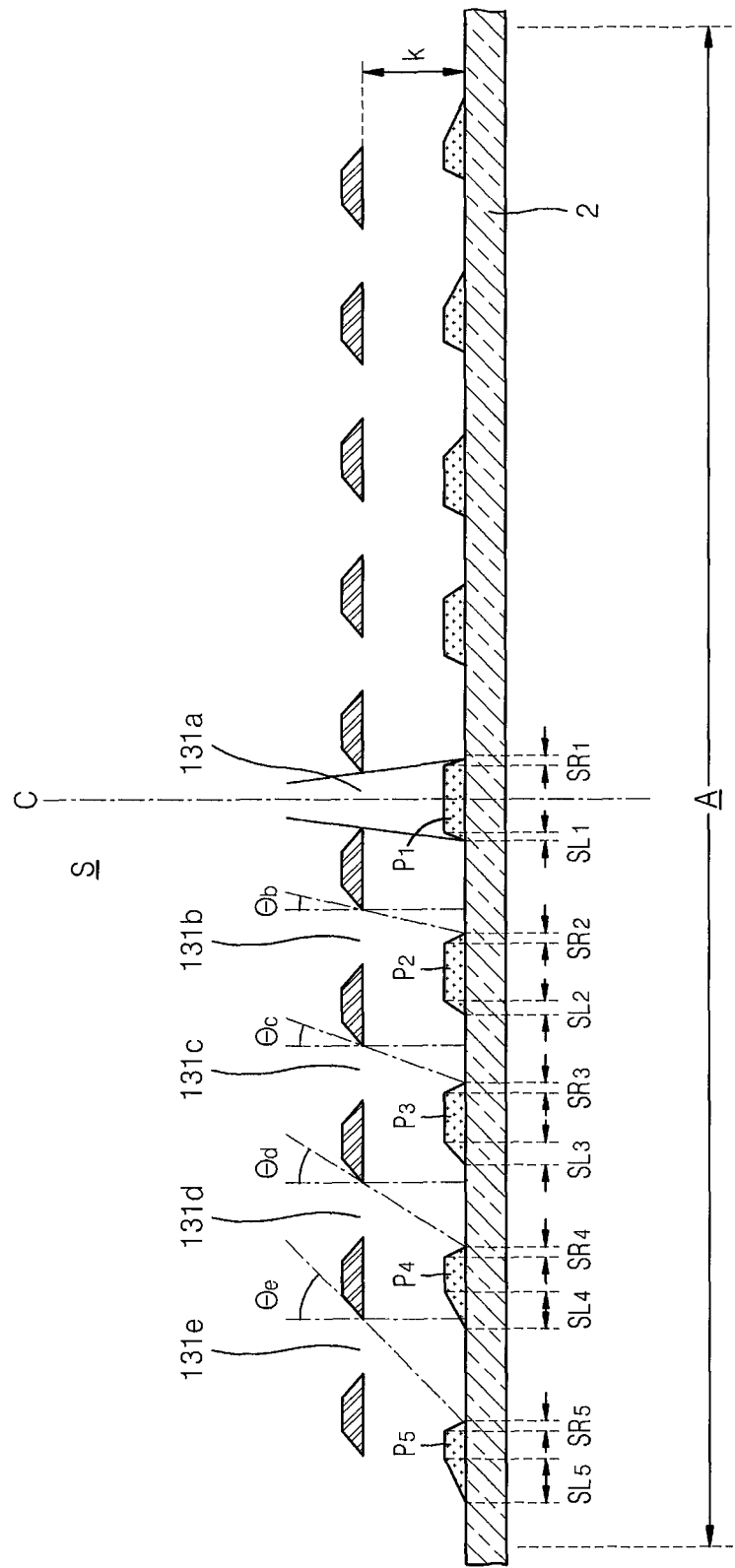
FIG. 12 schematically shows an organic layer formed on a substrate by using the patterning slit sheet shown in FIG. 11, according to an embodiment of the present invention.

FIG. 11 schematically shows the patterning slits 131 that are formed at equal intervals in the patterning slit sheet 130 of an organic layer deposition apparatus, according to an embodiment of the present invention. FIG. 12 schematically shows an organic layer formed on a substrate by using the patterning slit sheet 130 shown in FIG. 11, according to an embodiment of the present invention.

FIGS. 11 and 12 show the patterning slit sheet 130 in which the patterning slits 131 are formed at equal intervals. In other words, in FIG. 10, a relationship of $I_1=I_2=I_3=I_4$ is established.

In this case, an incidence angle of the deposition material passing through a central line C of the deposition space S is nearly (or substantially) perpendicular to the substrate 2. Accordingly, an organic layer $P_1$ formed by the deposition material, which has passed through a patterning slit 131a, has a reduced or minimum shadow size where a right shadow $SR_1$ and a left shadow $SL_1$ are symmetrical to each other.

However, a threshold incidence angle θ of the deposition material passing through the patterning slit gradually increases the farther the patterning slit is from the central line C of the deposition space S, and thus, the threshold incidence angle θ of the deposition material passing through an outermost patterning slit 131e is about 55°. Accordingly, the deposition material is obliquely incident on the patterning slit 131e, and an organic layer $P_5$ formed by the deposition material, which has passed through the patterning slit 131e, may have an increased or a maximum shadow size, and in particular, a left shadow $SR_5$ may be formed longer than a right shadow $SR_5$.

In other words, as the threshold incidence angle θ of the deposition material increases, a size of the shadow increases, and in particular, a size of the shadow increases the farther away from the central line C of the deposition space S. Also, as a distance between a central portion of the deposition space S and the patterning slit increases, the threshold incidence angle θ of the deposition material increases. Accordingly, as the organic layer has a longer distance from the central line C of the deposition space S and the patterning slit the size of the shadow increases. For example, among shadows of two sides of the organic layer, the shadow that is far away from the central line C of the deposition space S has a larger size.

In other words, referring to FIG. 12, in the organic layers formed on the left side of the central line C of the deposition space S, a left-oblique side of the organic layer is formed longer than a right-oblique side. Also, in the organic layers formed on the right side of the central line C of the deposition space S, a right-oblique side of the organic layer is formed longer than a left-oblique side.

In the organic layers formed on the left side of the central line C of the deposition space S, as a distance between the organic layer and the central line C increases, a length of a left-oblique side of the organic layer increases. Also, in the organic layers formed on the right side of the central line C of the deposition space S, as a distance between the organic layer and the central line C increases, a length of a right-oblique side of the organic layer increases. Consequently, the organic layers formed inside the deposition space S may be formed to be symmetrical to each other about the central line C of the deposition space S, which will now be described in detail The deposition materials pass through a patterning slit 131b at a threshold incidence angle of $θ_b$. In this case, a left shadow of an organic layer $P_2$ formed by the deposition material having passed through the patterning slit 131b, is formed to have a size of $SL_2$. Similarly, the deposition materials pass through a patterning slit 131c at a threshold incidence angle of $θ_c$. In this case, a left shadow of an organic layer $P_3$ formed by the deposition material having passed through the patterning slit 131c, is formed to have a size of $SL_3$. Similarly, the deposition materials pass through a patterning slit 131d at a threshold incidence angle of $θ_d$. In this case, a left shadow of an organic layer $P_4$ formed by the deposition material having passed through the patterning slit 131d, is formed to have a size of $SL_4$. Finally, the deposition materials pass through the patterning slit 131e at a threshold incidence angle of $θ_e$. In this case, a left shadow of the organic layer $P_5$ formed by the deposition material having passed through the patterning slit 131e, is formed to have a size of $SL_5$.

Here, because a relationship of $θ_b<θ_c<θ_d<θ_e$ is established, a relationship of $SL_1<SL_2<SL_3<SL_4<SL_5$ is established between sizes of the shadows of the organic layers of which deposition materials passed through the patterning slits.

Figure 13:
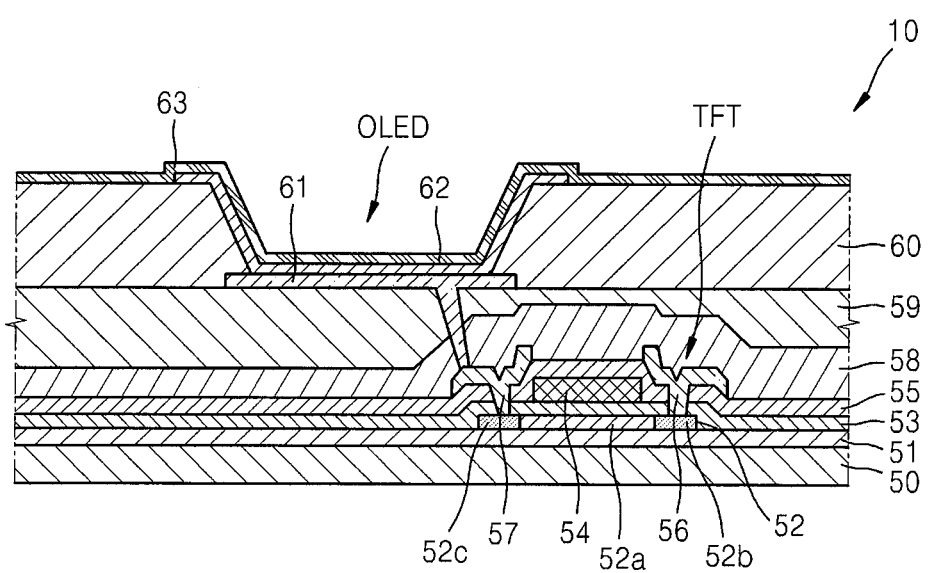
FIG. 13 is a cross-sectional view of an active matrix type organic light-emitting display apparatus manufactured using an organic layer deposition apparatus, according to an embodiment of the present invention.

FIG. 13 is a cross-sectional view of an active matrix type organic light-emitting display apparatus 10 manufactured using an organic layer deposition apparatus, according to an embodiment of the present invention.

Referring to FIG. 13, the active matrix type organic light-emitting display apparatus 10 is formed on the substrate 2. The substrate 2 may be formed of a transparent material, for example, a glass, plastic, or metal material. An insulating layer 51, such as a buffer layer, may be formed on an entire area of the substrate 2.

A thin film transistor TFT as shown in FIG. 13, a capacitor (not shown), and an organic light-emitting device OLED are formed on the insulating layer 51.

A semiconductor active layer 52 is formed on the insulating layer 51 (e.g., formed in a predetermined pattern). The semiconductor active layer 52 is covered by a gate insulating layer 53. The semiconductor active layer 52 may be formed of a p- or n-type semiconductor.

A gate electrode 54 of the TFT is formed on the gate insulating layer 32 to correspond to the semiconductor active layer 52. An insulating interlayer 55 is formed to cover the gate electrode 54. After the insulating interlayer 55 is formed, a contact hole is formed in the gate insulating layer 53 and the insulating interlayer 55 by etching the gate insulating layer 53 and the insulating interlayer 55 by using an etching process, such as dry etching, to expose a part of the semiconductor active layer 52.

Next, source/drain electrodes 56 and 57 are formed on the insulating interlayer 55 to contact the exposed part of the semiconductor active layer 52 through the contact hole. A passivation layer 58 is formed to cover the source/drain electrodes 56 and 57, and the drain electrode 57 is partially exposed by using an etching process. An insulating layer 59 may further be formed on the passivation layer 58 for planarization of the passivation layer 58.

An organic light-emitting device OLED emits red, green, or blue light according to current to display a predetermined piece of image information. A first electrode 61 is formed on the insulating layer 59. The first electrode 61 is electrically connected to one of the source/drain electrodes 57 of the TFT.

A pixel-defining layer 60 is formed to cover the first electrode 61. After a predetermined opening is formed in the pixel-defining layer 60, the organic layer 62, including an emission layer, is formed in an area defined by the opening. A second electrode 63 is formed on the organic layer 62.

The pixel-defining layer 60 divides each pixel and may be formed of an organic material. The pixel-defining layer 35 planarizes a surface of a substrate on which the first electrode 61 is formed, for example, a surface of the insulating layer 59.

The first electrode 61 and the second electrode 63 are insulated from each other, and apply voltages with different polarities to the organic layer 62 including the emission layer to emit light.

The organic layer 62 may be formed of a low-molecular weight organic material or a high-molecular weight organic material. If a low-molecular weight organic material is used, then the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and/or the like.

Here, the organic layer 62, including the emission layer, may be deposited by the organic layer deposition apparatus 1 (see FIG. 1) shown in FIGS. 1 to 9. In other words, the organic layer deposition apparatus 1 is disposed to be spaced apart at a predetermined interval from the substrate 2 and then, while one of the organic layer deposition apparatus 1 (see FIG. 1) and the substrate 2 (see FIG. 1) relatively moves with respect to the other one, the deposition material discharged from the organic layer deposition apparatus 1 is deposited on the substrate 2 to which deposition is to be performed, wherein the organic layer deposition apparatus 1 includes the deposition source discharging the deposition material; the deposition source nozzle unit that is disposed at one side of the deposition source and in which the plurality of deposition source nozzles are formed; and the patterning slit sheet that is disposed to be opposite to the deposition source nozzle unit and in which the plurality of patterning slits are formed.

After the organic layer 62 is formed, the second electrode 63 may be formed according to the same deposition method used to form the organic layer 62.

The first electrode 61 may function as an anode and the second electrode 63 may function as a cathode, or vice versa. The first electrode 61 may be patterned to correspond to individual pixel regions, and the second electrode 63 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), or an indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a transparent electrode layer of ITO, IZO, ZnO, or $In_2O_3$ on the reflective layer. The first electrode 61 may be formed by forming a layer by, for example, sputtering, and then patterning the layer by, for example, photolithography.

The second electrode 63 may also be formed as a transparent electrode or a reflective electrode. When the second electrode 63 is formed as a transparent electrode, the second electrode 63 functions as a cathode. The transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 62, and forming an auxiliary electrode layer or a bus electrode line thereon from ITO, IZO, ZnO, $In_2O_3$, or the like. When the second electrode 63 is formed as a reflective electrode, a reflective layer may be formed by depositing Li, Ca, LiF/Ca, LiF/Al, Al, Ag, Mg, or a compound thereof on the organic layer 62. The second electrode 63 may be formed according to the same deposition method used to form the organic layer 62.

The organic layer deposition apparatuses according to the above embodiments of the present invention may be applied to form an organic or inorganic layer of an organic TFT, and to form layers from various materials.

One or more embodiments of the present invention provide an organic layer deposition apparatus that may further be suitable for mass production of organic light emitting apparatuses on large-size substrates, may enable high-precision patterning, and may prevent interference between sensors of first and second organic layer deposition units, a method of manufacturing an organic light-emitting display apparatus using the organic layer deposition apparatus, and an organic light-emitting display apparatus manufactured using the method.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display apparatus by using an organic layer deposition apparatus for forming an organic layer on a substrate, the method comprising:
    fixing the substrate to a transfer unit in a loading unit;
    transferring the transfer unit to which the substrate is fixed into a chamber by using a first conveyer unit configured to pass through the chamber in a first direction;
    forming the organic layer by depositing a deposition material discharged from an organic layer deposition assembly onto the substrate while relatively moving the substrate with respect to the organic layer deposition assembly in such a way that the organic layer deposition assembly disposed inside the chamber is spaced from the substrate at an interval;
    separating the substrate on which deposition has been completed in an unloading unit from the transfer unit; and
    transferring the transfer unit separated from the substrate to the loading unit by using a second conveyer unit arranged to pass through the chamber in a second direction opposite to the first direction,
    wherein the organic layer deposition assembly comprises a first organic layer deposition unit and a second organic layer deposition unit,
    wherein the first organic layer deposition unit is arranged in such a way that a longitudinal direction of the first organic layer deposition unit is parallel to a longitudinal direction of the second organic layer deposition unit,
    wherein each of the first and second organic layer deposition units comprises:
        a deposition source for discharging a deposition material;
        a deposition source nozzle unit that is at one side of the deposition source and at which one or more deposition source nozzles are formed;
        a patterning slit sheet that is opposite to the deposition source nozzle unit and in which one or more patterning slits are formed; and
        first and second sensors that are at two ends of the deposition source in a longitudinal direction of the deposition source to face each other and measure an amount of vaporization of the deposition material,
    wherein the deposition material discharged from the deposition source passes through the patterning slit sheet and is deposited onto the substrate to form a pattern.

2. The method of claim 1, wherein a plurality of thin film deposition assemblies is inside the chamber so that deposition is sequentially performed on the substrate by the thin film deposition assemblies.

3. The method of claim 1, wherein the transfer unit circulates between the first conveyer unit and the second conveyer unit.

4. The method of claim 1, wherein the first conveyer unit and the second conveyer unit are arranged one on top of the other, and are parallel to each other.

5. The method of claim 1, wherein the patterning slit sheet of at least one of the organic layer deposition units is smaller than the substrate in at least one of a length direction of the substrate or a width direction perpendicular to the length direction.

6. The method of claim 1, wherein the first organic layer deposition unit is not located on a virtual extending line in the longitudinal direction of the second organic layer deposition unit.

7. The method of claim 1, wherein the first organic layer deposition unit and the second organic layer deposition unit are arranged not to be superposed with each other in the first direction.

8. The method of claim 1, wherein the longitudinal direction of the deposition source of at least one of the organic layer deposition units is perpendicular to the first direction.

9. The method of claim 1, wherein the deposition source of at least one of the organic layer deposition units comprises:
    at least one crucible located in the longitudinal direction of the deposition source;
    a heater that surrounds the crucible and heats the crucible; and
    a cooling housing surrounding the heater.

10. The method of claim 9, wherein the cooling housing is configured to prevent heat generated by the heater from being discharged out of the deposition source.

11. The method of claim 9, wherein the at least one crucible comprises a first crucible and a second crucible, and the first and second crucibles are inside the cooling housing.

12. The method of claim 11, wherein the first sensor of the at least one of the organic layer deposition units is configured to measure an amount of deposition material discharged from the first crucible, and the second sensor of the at least one of the organic layer deposition units is configured to measure an amount of deposition material discharged from the second crucible.

13. The method of claim 1, wherein the first conveyer unit and the second conveyer unit are configured to pass through at least one of the organic layer deposition units.

14. The method of claim 1, wherein the first conveyer unit moves the transfer unit to the loading unit, at least one of the organic layer deposition units, and the unloading unit in that order.

15. The method of claim 1, wherein the second conveyer unit is configured to move the transfer unit to the unloading unit, at least one of the organic layer deposition units, and the loading unit in that order.

16. The method of claim 1, wherein the patterning slit sheet of the organic layer deposition assembly is smaller than the substrate in at least one of the first direction or a third direction that is substantially perpendicular to the first direction.

17. The method of claim 1, wherein, in at least one of the organic layer deposition units, a plurality of the deposition source nozzles are formed in the deposition source nozzle unit along a third direction that is substantially perpendicular to the first direction, a plurality of the patterning slits are formed in the patterning slit sheet along the third direction, and
    wherein the at least one of the organic layer deposition units further comprises a blocking plate assembly comprising a plurality of first blocking plates that are arranged along the third direction between the deposition source nozzle unit of the at least one of the organic layer deposition units and the patterning slit sheet to divide a space between the deposition source nozzle unit and the patterning slit sheet into a plurality of deposition spaces.

18. The method of claim 17, wherein each of the first blocking plates extends in the first direction.

19. The method of claim 18, wherein the blocking plate assembly comprises a first blocking plate assembly comprising the plurality of first blocking plates and a second blocking plate assembly comprising a plurality of second blocking plates.

20. The method of claim 19, wherein, in the at least one of the organic layer deposition units, the first blocking plates and the second blocking plates are arranged along the third direction that is substantially perpendicular to the first direction so that the space between the deposition source nozzle unit and the patterning slit sheet is divided into the plurality of deposition spaces.

21. The method of claim 1, wherein, in at least one of the organic layer deposition units, a plurality of the deposition source nozzles are formed in the deposition source nozzle unit along the first direction, and wherein, in the at least one of the organic layer deposition units, a plurality of the patterning slits are formed in the patterning slit sheet in a third direction that is substantially perpendicular to the first direction.

22. The method of claim 21, wherein the deposition source, the deposition source nozzle unit, and the patterning slit sheet of the at least one of the organic layer deposition units are coupled to each other as one body by a connection member.

23. The method of claim 22, wherein the connection member is configured to guide a transfer path of the deposition material discharged from the at least one of the organic layer deposition units.

24. The method of claim 23, wherein, in the at least one of the organic layer deposition units, the connection member seals a space between the deposition source, the deposition source nozzle unit, and the patterning slit sheet.

* * * * *